United States Patent
Lee et al.

(10) Patent No.: US 9,550,219 B2
(45) Date of Patent: Jan. 24, 2017

(54) APPARATUS OF INHALATION TYPE FOR STOCKING WAFER AT CEILING AND INHALING TYPE WAFER STOCKING SYSTEM HAVING THE SAME

(71) Applicant: CLEAN FACTOMATION, INC., Hwaseong-si (KR)

(72) Inventors: Ho Geun Lee, Asan-si (KR); Dong Gyu Yoo, Asan-si (KR); Jae Hyun Lee, Asan-si (KR); Jung Young Lee, Asan-si (KR); Jun Han Lee, Asan-si (KR); Jun Pil Yun, Asan-si (KR); Ju Sik Jo, Asan-si (KR); Yong Hwan Gwon, Asan-si (KR); Sung Goo Choi, Asan-si (KR)

(73) Assignee: Daifuku Co., Ltd., Osaka (JP)

(*) Notice: Subject to any disclaimer, the term of this patent is extended or adjusted under 35 U.S.C. 154(b) by 0 days.

(21) Appl. No.: 14/584,675

(22) Filed: Dec. 29, 2014

(65) Prior Publication Data

US 2016/0184873 A1   Jun. 30, 2016

(51) Int. Cl.
| | | |
|---|---|---|
| B08B 15/00 | (2006.01) |
| B08B 15/02 | (2006.01) |
| B65G 1/06 | (2006.01) |
| F24F 7/06 | (2006.01) |
| H01L 21/683 | (2006.01) |
| H01L 21/673 | (2006.01) |
| H01L 21/677 | (2006.01) |

(52) U.S. Cl.
CPC ............... *B08B 15/02* (2013.01); *B65G 1/065* (2013.01); *F24F 7/065* (2013.01); *H01L 21/67389* (2013.01); *H01L 21/67733* (2013.01); *H01L 21/67769* (2013.01); *H01L 21/683* (2013.01)

(58) Field of Classification Search
CPC .. B65G 1/065; H01L 21/683; H01L 21/67017; H01L 21/6772; H01L 21/67393; F24F 7/065
USPC .......... 414/222.01, 217, 939, 940; 141/7, 66
See application file for complete search history.

(56) References Cited

U.S. PATENT DOCUMENTS

| | | | | |
|---|---|---|---|---|
| 6,364,762 B1* | 4/2002 | Kaveh | ............... | H01L 21/67778 454/187 |
| 6,368,208 B1* | 4/2002 | Minoshima | ............. | F24F 3/161 414/435 |
| 7,314,068 B2* | 1/2008 | Nakano | ............. | H01L 21/67017 141/66 |
| 8,545,296 B2* | 10/2013 | Uematsu | ................. | F24F 3/161 454/187 |
| 8,596,312 B2* | 12/2013 | Natsume | ........... | H01L 21/67775 141/63 |

(Continued)

FOREIGN PATENT DOCUMENTS

| | | |
|---|---|---|
| JP | 2010-147451 | 7/2010 |
| KR | 10-2012-0018062 A | 2/2012 |

*Primary Examiner* — Kaitlin Joerger
(74) *Attorney, Agent, or Firm* — Greer Burns & Crain Ltd.

(57) ABSTRACT

Provided is an apparatus of an inhalation type for stocking a wafer at a ceiling and an inhaling type wafer stocking system having the same including a stocking system having a shelf that is fixed to a ceiling and supports a container in which a wafer is present; and an inhalation assembly that is installed in the stocking system so as to correspond to the shelf and is configured so as to inhale gas that leaks from the container.

13 Claims, 8 Drawing Sheets

(56) References Cited

U.S. PATENT DOCUMENTS

| | | | | |
|---|---|---|---|---|
| 8,978,718 B2* | 3/2015 | Emoto | ............. | H01L 21/67017 |
| | | | | 141/51 |
| 2004/0002299 A1* | 1/2004 | Lin | ................. | H01L 21/67201 |
| | | | | 454/184 |
| 2005/0274430 A1* | 12/2005 | Yokoi | ............. | H01L 21/67017 |
| | | | | 141/65 |
| 2007/0066204 A1* | 3/2007 | Tanimura | ......... | H01L 21/67017 |
| | | | | 454/65 |
| 2012/0309286 A1* | 12/2012 | Nakano | ............ | H01L 21/67775 |
| | | | | 454/305 |
| 2014/0041755 A1* | 2/2014 | Chou | ............... | H01L 21/67393 |
| | | | | 141/113 |
| 2014/0087649 A1* | 3/2014 | Jiang | ........................ | H05F 1/00 |
| | | | | 454/187 |
| 2014/0366983 A1* | 12/2014 | Takahara | ............... | F17C 13/02 |
| | | | | 141/197 |
| 2015/0000785 A1* | 1/2015 | Shin | ........................ | F17C 5/007 |
| | | | | 141/4 |
| 2015/0000789 A1* | 1/2015 | Otsuka | ............. | H01L 21/67769 |
| | | | | 141/369 |
| 2015/0004899 A1* | 1/2015 | Otsuka | .................... | F24F 3/161 |
| | | | | 454/341 |
| 2015/0024671 A1* | 1/2015 | Taniyama | ................ | F24F 9/00 |
| | | | | 454/193 |
| 2015/0214078 A1* | 7/2015 | Iwamoto | .......... | H01L 21/67772 |
| | | | | 414/304 |

* cited by examiner

APPARATUS OF INHALATION TYPE FOR STOCKING WAFER AT CEILING AND INHALING TYPE WAFER STOCKING SYSTEM HAVING THE SAME

TECHNICAL FIELD

The present invention relates to an apparatus and a system for stocking wafers to be used in the following stage during a semiconductor manufacturing process.

BACKGROUND ART

Generally, in semiconductor manufacturing processes, wafers are produced, and the produced wafers are transferred to the following stage so as to manufacture a semiconductor package.

In this case, the produced wafers are not immediately used for the following stage, but are sent to the following stage in order if necessary after being stocked for a given period of time. Thus, a facility for such stocking is required.

The facility for the stocking is installed on the ground in a semiconductor factory, and there is a problem that a large space is occupied.

Additionally, during the stocking in the stocking facility the wafers may be damaged as time goes by. In order to prevent this damage, during the stocking in the stocking facility or when gas is injected before the stocking, gas may leak from a container in which the wafers are contained, and the concentration of the gas in the air may become high.

DISCLOSURE OF THE INVENTION

Problem that the Invention is to Solve

An object of the invention is to provide an apparatus of an inhalation type for stocking a wafer at a ceiling and an inhaling type wafer stocking system having the same that can remove gas that leaks from a container that contains the wafers while enhancing the usability of a space.

Means for Solving the Problem

In order to realize the aforementioned object, an apparatus of an inhalation type for stocking a wafer at a ceiling related to an aspect of the invention includes a stocking system including a shelf that is fixed to a ceiling and supports a container in which a wafer is present; and an inhalation assembly that is installed in the stocking system so as to correspond to the shelf and is configured so as to inhale gas that leaks from the container.

Here, the inhalation assembly may include an inhalation module having an inhalation surface that intersects a main surface of the shelf.

Here, the inhalation module may include an inhalation plate that forms an inhalation surface and is formed with an inhalation slit; and an outer hood that is coupled to the inhalation plate and forms an internal space.

Here, the inhalation slit may be formed at an edge of the inhalation plate.

Here, the inhalation slit may have a plurality of sides corresponding to a closed roof.

Here, the inhalation module may further include an inner hood that is arranged in an internal space and is located within a region defined by the inhalation slit.

Here, the inner hood may have the same shape as the outer hood and may have a size smaller than the outer hood.

Here, the inhalation module may further include a sealing member that is formed by a closed roof surrounding the inner hood and is arranged between the inhalation plate and the outer hood.

Here, the inhalation assembly may further include an inhalation pipe that communicates with the internal space of the outer hood; and an inhalation pump that is coupled to the inhalation pipe.

Here, the inhalation plate and the inner hood may be respectively formed with removed portions corresponding to each other, and the stocking system may include a sensor bracket that is installed in the inhalation plate and is located in the removed portion.

Here, the apparatus of an inhalation type for stocking a wafer at a ceiling may further include a purge assembly that is installed in the stocking system so as to communicate with the container located on the shelf and that injects gas into the container to purge the wafer.

Here, the purge assembly may include a supply unit that is configured so as to supply the gas into the interior of the container; and an exhaust unit that is configured so as to exhaust gas injected into the interior of the container.

Here, the shelf may include a supply nozzle and an exhaust nozzle that are formed so as to communicate with the interior of the container, and each of the supply unit and the exhaust unit may include a main pipe that is formed so that the gas flows therethrough; and a subsidiary pipe that is branched from the main pipe and is coupled to the supply nozzle or the exhaust nozzle.

An inhaling type wafer stocking system related to another aspect of the invention includes a vehicle rail that is fixed to a ceiling; a vehicle that is movably coupled to the vehicle rail and carries a container, in which a wafer is present, along the vehicle rail; a stocking system that is located beside the vehicle rail and is configured so as to have the container transferred thereto from the vehicle and stock the container; a purge assembly that is installed in the stocking system and is configured so as to inject gas into the container and purge the wafer; and an inhalation assembly that is installed in the stocking system and is configured so as to inhale the gas that leaks from the container.

Here, the stocking system may include a shelf that supports the container and has a supply nozzle and an exhaust nozzle coupled to the purge assembly, and the purge assembly may include an inhalation module having an inhalation surface that intersects a main surface of the shelf.

Here, the inhalation module may include an inhalation plate that forms an inhalation surface and is formed with an inhalation slit; and an outer hood that is coupled to the inhalation plate and forms an internal space.

Here, the stocking system may further include a container detecting sensor that detects that the container is located, and the purge assembly and the inhalation assembly may be operated if it is determined that the container is located on the shelf through the container detecting sensor.

Advantage of the Invention

According to the apparatus of an inhalation type for stocking a wafer at a ceiling and the inhaling type wafer stocking system having the same related to the invention as described above, gas that leaks from the container that contains the wafer can be removed while enhancing the usability of a space.

BEST MODE FOR CARRYING OUT THE INVENTION

An apparatus of an inhalation type for stocking a wafer at a ceiling and an inhaling type wafer stocking system having the same according to preferable embodiments of the invention will be described below in detail with reference to the accompanying drawings. In the present specification, even in mutually different embodiments, the same or similar components will be designated by the same or similar reference numbers, and the description thereof will be substituted with the first description.

Figure 1:
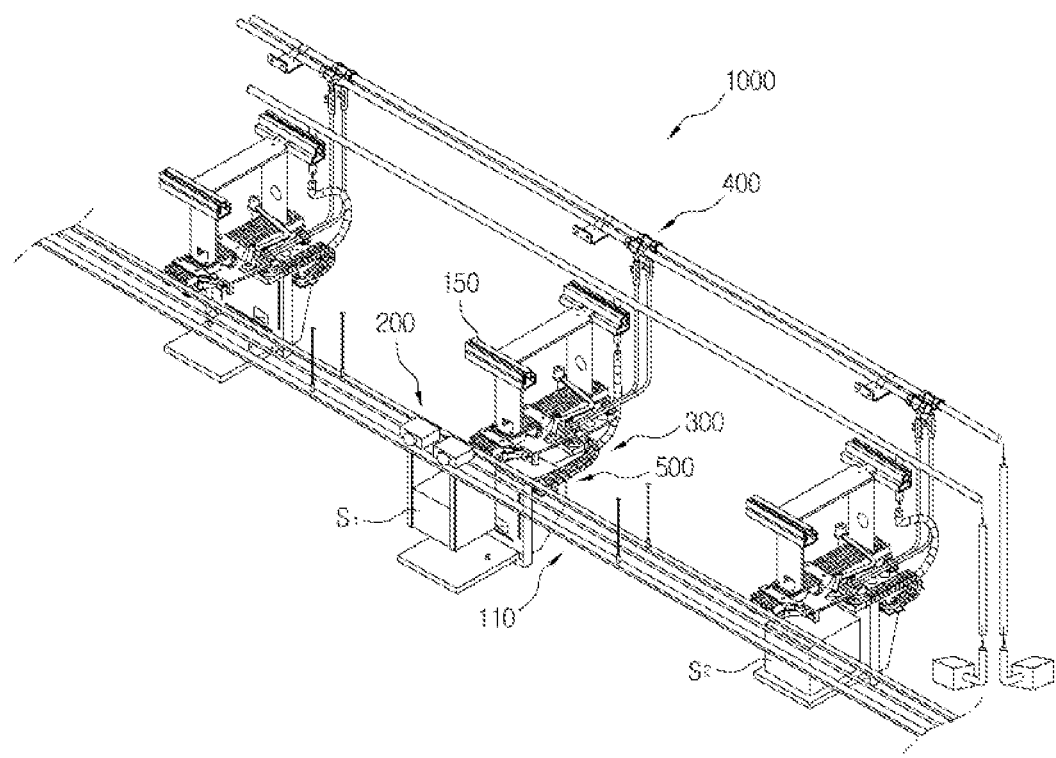
FIG. 1 is a perspective view illustrating an inhaling type wafer stocking system (1000) according to an embodiment of the invention.

FIG. 1 is a perspective view illustrating an inhaling type wafer stocking system (1000) according to an embodiment of the invention.

Referring to this drawing, the inhaling type wafer stocking system (1000) can include a vehicle rail (110), a vehicle (200), an active advance and retraction stocking system (300), a purge assembly (400), and an inhalation assembly (500). Here, the active advance and retraction stocking system (300) and the inhalation assembly (500), and further the purge assembly (400) can be referred to as an apparatus of an inhalation type for stocking a wafer at a ceiling. Additionally, an active advance and retraction stocking system (300) together with the fixed stocking system (600, FIG. 7) to be described below can be simply referred to as a stocking system.

The vehicle rail (110) is installed on a ceiling (C) so as to form the movement path of the vehicle (200). The vehicle rail (110) can be formed so as to make two lines, for example, a closed curve type line. The frame (150) is configured so as to be arranged beside the vehicle rail (110). The frame (150) can also be formed so as to make two lines, and is fixed to the ceiling (C).

The vehicle (200) is coupled to the vehicle rail (110) so as to move along the movement path. The vehicle (200) is loaded with a container ($S_1$) that contains wafers. The vehicle (200) includes means for loading the container ($S_1$) and means for unloading the container ($S_1$).

The active advance and retraction stocking system (300) is a kind of the stocking system, and is installed in the frame (150), specifically, at the ceiling (C) to stock the container ($S_2$). Here, although the container ($S_2$) is the same as that of the container ($S_1$) loaded into the vehicle (200), these containers are distinguished from each other in the need of description. Specifically, the container ($S_1$) is loaded into the vehicle (200), and as the active advance and retraction stocking system (300) moves to advance toward the vehicle (200), the container ($S_2$) is transferred thereto. The active advance and retraction stocking system (300) is configured so as to return to its original position after the container ($S_2$) is transferred thereto. The active advance and retraction stocking system (300) can be arranged so as to be located beside the vehicle rail (110). Additionally, several or tens of active advance and retraction stocking systems (300) are installed in one frame (150), and a plurality of the active advance and retraction stocking systems (300) can be associated with one vehicle (200).

The purge assembly (400) is a configured in order to supply purge gas, for example, nitrogen ($N_2$) into the container ($S_2$) stocked in the active advance and retraction stocking system (300). For this reason, the purge assembly (400) can communicate with the container ($S_2$) through the active advance and retraction stocking system (300).

The inhalation assembly (500) is installed in the active advance and retraction stocking system (300) and is configured so as to inhale that the gas leaked from the container ($S_2$). In this case, the leaked gas is gas that has leaked from the gas injected into the container ($S_2$) by the purge assembly (400) or gas that has leaked from the gas injected in the stage before the container ($S_2$) moves to the active advance and retraction stocking system (300).

According to such a configuration, the vehicle (200) is loaded with the container ($S_1$) in which wafers manufactured in the previous stage are contained, and moves along the vehicle rail (110). The vehicle (200) stops corresponding to an assigned active advance and retraction stocking system (300) during movement. The active advance and retraction stocking system (300) moves [moves to the state in FIG. 1] to advance toward the vehicle (200) so that the container ($S_1$) is transferred thereto, and moves [moves to the state in FIG. 2] to retract to its original position so as to stock the container ($S_2$). The wafers within the container ($S_2$) are purged by the action of the purge assembly (400) with respect to the stocked container ($S_2$).

Accordingly, the wafers contained within the container ($S_2$) can be purged by the gas, and can be stocked for a longer time than in a case where there is no purge. Additionally, since the container ($S_2$) has been stocked on the ceiling (C) side for a longer time by the active advance and retraction stocking system (300) and the purge assembly (400), the usability of a space near a floor surface is increased.

Additionally, the gas leaked from the container ($S_2$) through purge or the like by the purge assembly (400) can be separately collected by the inhalation assembly (500). This can prevent the leaked gas from being discharged without any restriction to a space where the active advance and retraction stocking system (300) is installed.

The active advance and retraction stocking system (300), the purge assembly (400), and the inhalation assembly (500) as described above will be specifically described with reference to FIG. 2.

Figure 2:
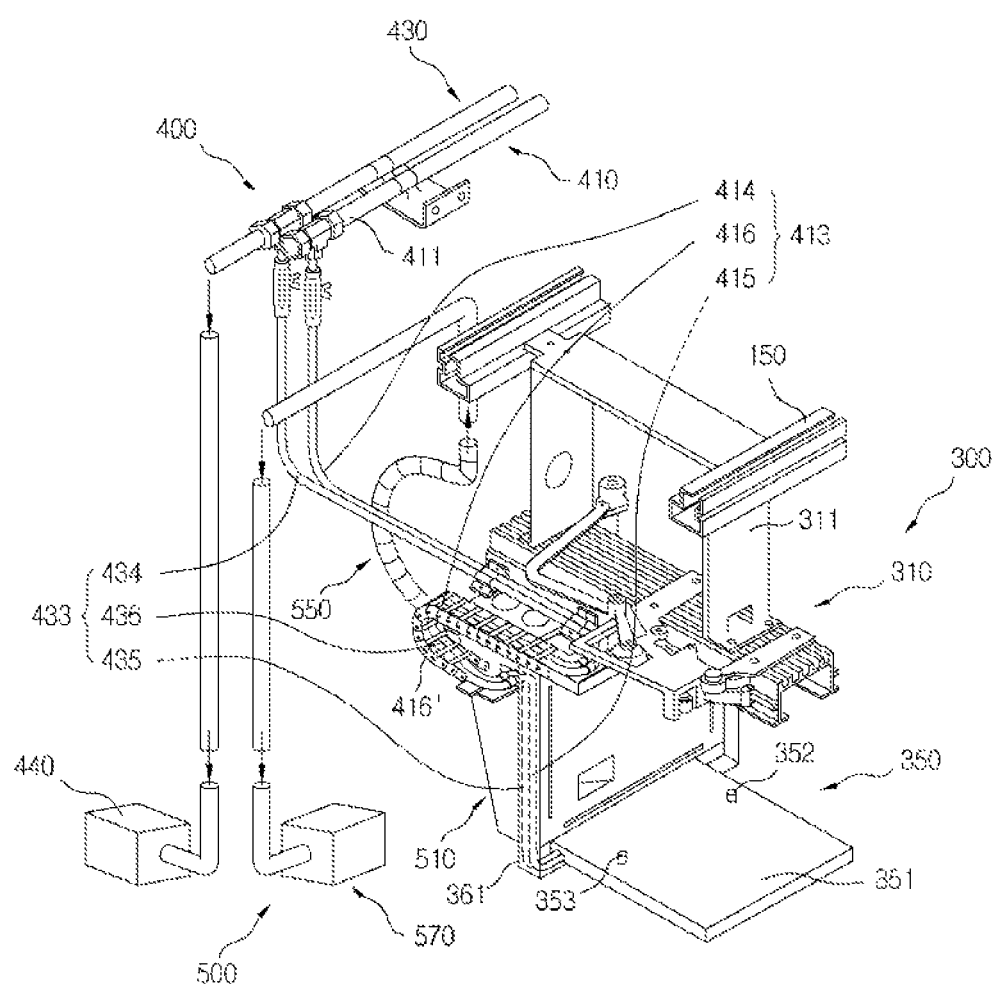
FIG. 2 is a perspective view illustrating the coupling relationship of an active advance and retraction stocking system (300), a purge assembly (400), and an inhalation assembly (500) of FIG. 1.

FIG. 2 is a perspective view illustrating the coupling relationship of the active advance and retraction stocking system (300), the purge assembly (400), and the inhalation assembly (500) of FIG. 1.

Referring to this drawing, first, the active advance and retraction stocking system (300) can include a fixed body (310) and a movable body (350).

The fixed body (310) is fixed to the ceiling (C) via the frame (150). The fixed body (310) can include an installation platform (311) and an advance and retraction rail (321). The installation platform (311) is coupled to the frame (150). The advance and retraction rail (321) is a rail installed on the installation platform (311). In the advance and retraction rail (321), an extending direction of the rail becomes a direction [advance/retraction direction (M)] that is directed to the lower side of the vehicle (200).

The movable body (350) is movably coupled to the fixed body (310), specifically the advance and retraction rail (321). The movable body (350) can include a shelf (351) and a coupling platform (361). The shelf (351) is spaced apart from the advance and retraction rail (321), and is formed so as to support the container ($S_2$, FIG. 1). Specifically, the shelf (351) is arranged substantially parallel to the ceiling (C). A shelf (351) is provided with a supply nozzle (352) and an exhaust nozzle (353) that are formed so as to communicate with the interior of the container ($S_2$, FIG. 1). One end of the coupling platform (361) couples one corner side of the shelf (351) and the advance and retraction rail (321). The other end of the coupling platform (361) can be slidably inserted into the advance and retraction rail (321).

Next, the purge assembly (400) can include a supply unit (410) and an exhaust unit (430). The supply unit (410) is formed so as to supply gas to the interior of the container ($S_2$, FIG. 1). In contrast, the exhaust unit (430) is formed so as to exhaust the gas that has filled the interior of the container ($S_2$, FIG. 1).

The supply unit (410) and the exhaust unit (430) can include main pipes (411 and 431) and subsidiary pipes (413 and 433).

The main pipe (411) of the supply unit (410) communicates with a tank for supplying the gas, and the main pipe (431) of an exhaust unit (430) communicates with a tank for recovering the gas. The main pipes (411 and 431) can be installed so as to extend along the frame (150) (refer to FIG. 1).

The subsidiary pipes (413 and 433) couple the main pipes (411 and 431) and the shelf (351) [specifically, the supply nozzle (352) and the exhaust nozzle (353)] together. If one main pipe (411) and one main pipe (431) are provided for one frame (150), the subsidiary pipes (413 and 433) can be branched into a plurality of pieces at the main pipes (411 and 431) so as to correspond to respective active advance and retraction stocking systems (300).

The subsidiary pipe (413) of the supply unit (410) can include a first subsidiary pipe (414) coupled to the main pipe (411), and a second subsidiary pipe (415) that couples the first subsidiary pipe (414) and the supply nozzle (352) together. Furthermore, the subsidiary pipe (413) couples the first subsidiary pipe (414) and the second subsidiary pipe (415) together, and can further include a third subsidiary pipe (416) of which at least a portion is formed of a flexible material. Similar to this, the subsidiary pipe (433) of the exhaust unit (430) can include a first subsidiary pipe (434) coupled to the main pipe (431), and a second subsidiary pipe (435) that couples the first subsidiary pipe (434) and the supply nozzle (352) together. Additionally, the subsidiary pipe (433) couples the first subsidiary pipe (434) and the second subsidiary pipe (435) together, and can further include a third subsidiary pipe (436) of which at least a portion is formed of a flexible material. Here, the flow cross-sectional areas of the second subsidiary pipes (415 and 435) can be made smaller than those of the first subsidiary pipes (414 and 434).

Moreover, the third subsidiary pipes (416 and 436) can be protected by a Cableveyor (416'). The Cableveyor (416') has a hollow chain form, and contains the third subsidiary pipes (416 and 436) therein. The Cableveyor (416') can be installed so as to couple the movable body (350), specifically, the coupling platform (361) and the fixed body (310), specifically, the advance and retraction rail (321) together. Two Cableveyors can be provided unlike the above one Cableveyor (416'), and individually contain the respective third subsidiary pipes (416 and 436).

The above exhaust unit (430) can further include an exhaust pump (440) for pumping the gas within the container ($S_2$) to recover the gas in the tank. In contrast, the supply unit (410) does not separately need the pump if high-pressure nitrogen gas is made to flow toward the container ($S_2$) simply by applying the gas to the main pipe (411).

Finally, the inhalation assembly (500) can include an inhalation module (510), an inhalation pipe (550), and an inhalation pump (570).

The inhalation module (510) serves to collect the gas leaked from the container ($S_2$). Therefore, the inhalation module (510) can be located beside the shelf (351) where the container ($S_2$) is located. In the present embodiment, the inhalation module (510) is installed on the coupling platform (361). The inhalation module (510) forms a shape like a substantially quadrangular weight. Accordingly, the surface [inhalation surface (512)] of the quadrangular shape that is a wide surface of the inhalation module (510) faces a side surface of the container ($S_2$).

The inhalation pipe (550) communicates with the inhalation module (510), and the leaked gas collected in the inhalation module (510) is made to flow to another place. The inhalation pipe (550) can be partially fixed to the active advance and retraction stocking system (300). The inhalation pipe (550) can be fixed to the frame (150), and can be formed so as to extend along the frame (150).

The inhalation pump (570) communicates with the inhalation pipe (550), and is configured so that the leaked gas flowing along the inhalation pipe (550) is collected in the tank.

Among the same configurations, first, one (416) of the third subsidiary pipes (416 and 436) will be described with reference to FIG. 3. The other third subsidiary pipe (436) can have the same configuration as the one third subsidiary pipe (416).

Figure 3:
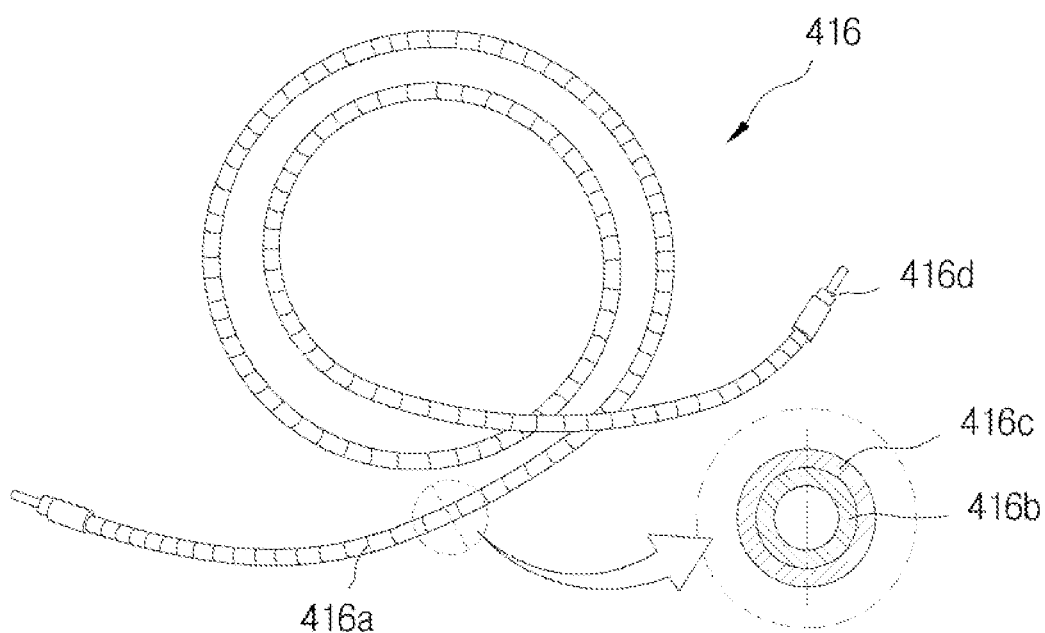
FIG. 3 is a perspective view illustrating a third subsidiary pipe (416) of FIG. 2 in an enlarged manner.

FIG. 3 is a perspective view illustrating the third subsidiary pipe (416) of FIG. 2 in an enlarged manner.

Referring to this drawing, the third subsidiary pipe (416) can include a pipe portion (416a) and an adapter (416d).

The pipe portion (416a) is a hollow body including a space through which the gas flows, and has flexibility. The pipe portion (416a) can include, specifically, an internal pipe (416b) and an external pipe (416c). The internal pipe (416b) can be formed of a Teflon material. The external pipe (416c) is arranged so as to cover the internal pipe (416b), and can establish a concentric relationship with the internal pipe (416b). The external pipe (416c) can be formed of a silicon material.

The adaptors (416d) are installed at both ends of the pipe portion (416a). The adaptors (416d) can be made of a metal material, such as stainless steel. The adaptors (416d) are inserted into the first subsidiary pipe (414) and the second subsidiary pipe (415), respectively, and the third subsidiary pipe (416) communicates with the first subsidiary pipe (414) and the second subsidiary pipe (415).

Such a third subsidiary pipe (416) can cause the first subsidiary pipe (414) and the second subsidiary pipe (415) to stably communicate with each other, specifically by virtue of the deformation of the pipe portion (416a), even in the advance and retraction movement of the movable body (350).

Next, the purge operation of the purge assembly (400) will be described with reference to FIG. 4.

Figure 4:
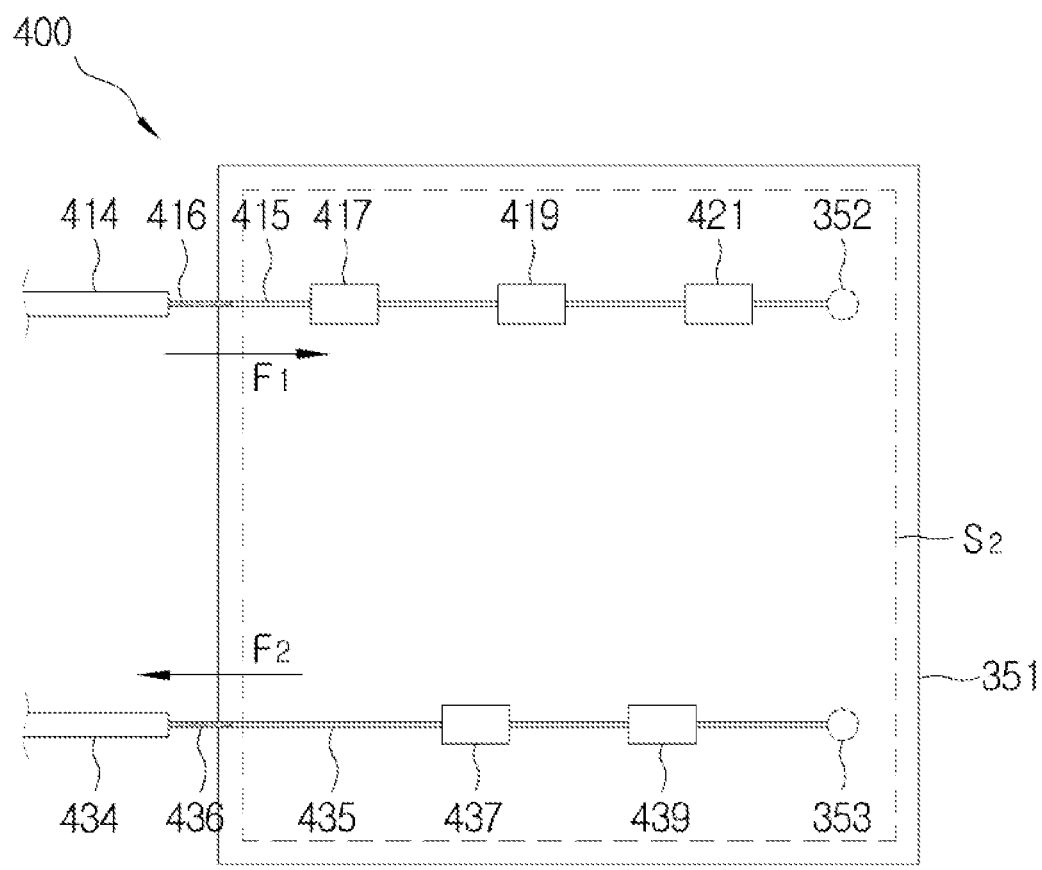
FIG. 4 is a conceptual diagram for describing the purge operation of the purge assembly (400) of FIG. 2 with respect to a container ($S_2$).

FIG. 4 is a conceptual diagram for describing the purge operation of the purge assembly (400) of FIG. 2 with respect to the container ($S_2$).

Referring to this drawing, the supply unit (410) can further include a supply valve (417), a supply flowmeter (419), and a gas filter (421), in addition to the aforementioned main pipe (411) and subsidiary pipe (413). All of the supply valve (417), the supply flowmeter (419) and the gas filter (421) are installed so as to communicate with the second subsidiary pipe (415). The supply valve (417) is formed so as to open and close a flow passage for flow of the gas in the second subsidiary pipe (415). The supply valve (417) is an electrical valve, and is formed so as to perform the operation for opening and closing according to an electrical signal. The supply flowmeter (419) is arranged between the supply valve (417) and the supply nozzle (352), and adjusts the flow rate of the gas directed to the supply nozzle (352) to a set value. The gas filter (421) is installed between the supply flowmeter (419) and the supply nozzle (352), and filters foreign matter in the gas to be supplied into the container ($S_2$) through the supply nozzle (352). Here, the supply valve (417) and the supply flowmeter (419) can be integrated by a digital mass flowmeter (Mass Flow Controller). In this case, the digital mass flowmeter can set the amount of supply of the gas depending on time and can be electronically controlled by a computer.

The exhaust unit (430) can further include an exhaust valve (437) and an exhaust flowmeter (439), in addition to the aforementioned main pipe (431) and subsidiary pipe (433). Both of the exhaust valve (437) and the exhaust flowmeter (439) are installed so as to communicate with the second subsidiary pipe (435). The exhaust valve (437) is formed so as to open and close a flow passage for flow of the gas in the second subsidiary pipe (435). The exhaust valve (437) is an electrical valve, and is formed so as to perform the operation for opening and closing according to an electrical signal. The exhaust flowmeter (439) is arranged between the exhaust valve (437) and the exhaust nozzle (353), and adjusts the flow rate of the gas exhausted to the outside of the container ($S_2$) through the exhaust nozzle (353) as being set.

An operation method of the above purge assembly (400) and inhalation assembly (500) will be described, additionally referring to FIG. 5. Here, FIG. 5 is a block diagram for describing the control configuration of the purge assembly (400) of FIG. 2.

Figure 5:
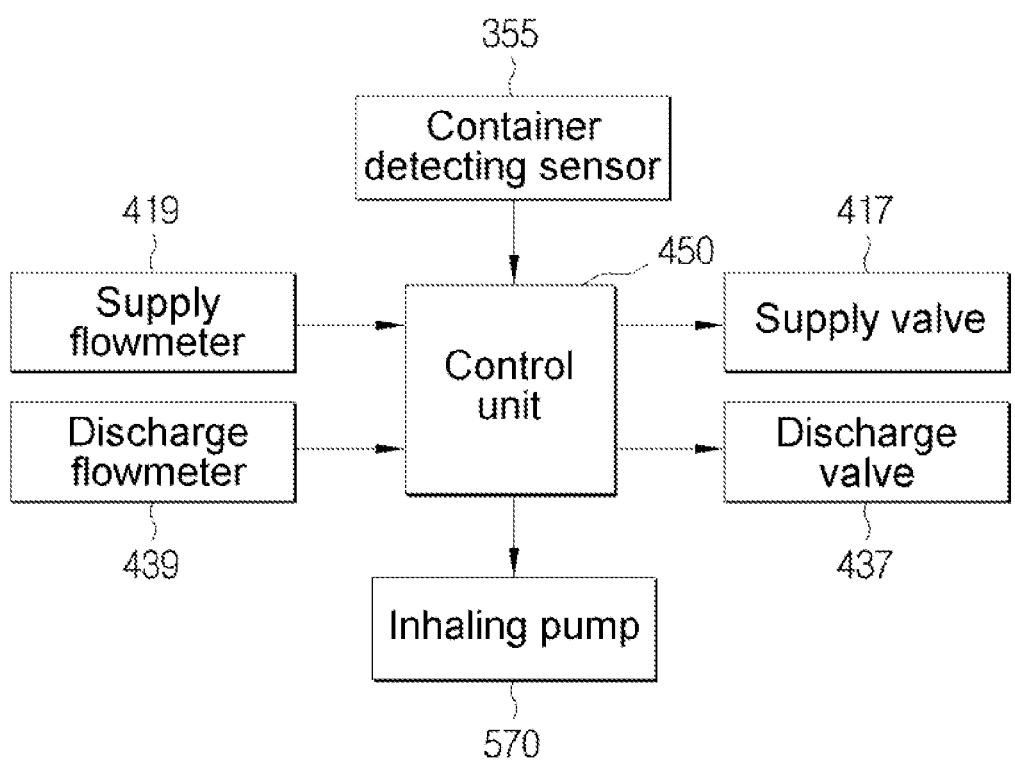
FIG. 5 is a block diagram for describing the control configuration of the purge assembly (400) and the inhalation assembly (500) of FIG. 2.

Referring to FIGS. 4 and 5, the shelf (351) can further include a container detecting sensor (355). The container detecting sensor (355) is installed on an upper surface side of the shelf (351), and is formed so as to grasp whether or not the container ($S_2$) is in the state of being located on the shelf (351).

The purge assembly (400) can further include a control unit (450) for controlling the operation of the aforementioned supply unit (410) and exhaust unit (430). The control unit (450) can have various kinds of information input from the supply flowmeter (419), the exhaust flowmeter (439), and the container detecting sensor (355), and control the operation of the supply valve (417) and the exhaust valve (437).

For example, the control unit (450) can control the opening and closing of the supply valve (417) and the exhaust valve (437) on the basis of a difference between a supply flow rate measured by the supply flowmeter (419) and an exhaust flow rate measured by the exhaust flowmeter (439). Specifically, if the exhaust flow rate is excluded from the supply flow rate, the amount of the gas that fills the interior of the container (52) is calculated. If the amount of the filled gas has not reached a reference, the exhaust valve (437) can be closed in a state where the supply valve (417) is open. In contrast, if the amount of the filled gas exceeds the reference, the exhaust valve (437) can be opened in a state where the supply valve (417) is closed.

Additionally, the control unit (450) can control the opening and closing of the supply valve (417) and/or the exhaust valve (437) on the basis of the detection result of the container detecting sensor (355). Specifically, the supply valve (417) can be opened when the container detecting sensor (355) has detected that the container ($S_2$) is present on the shelf (351). The control unit (450) can control the opening of the exhaust valve (437), if a given time passes and the interior of the container ($S_2$) is filled with a given amount of gas after the opening of the supply valve (417) is controlled.

The control unit (450) also controls the inhalation assembly (500) in addition to the purge assembly (400). Specifically, in a case where the container ($S_2$, refer to FIG. 1) is located on the shelf (351) and the purge assembly (400) is operated, the control unit (450) can operate the inhalation pump (570) of the inhalation assembly (500).

In a case where the inhalation pump (570) is operated, the inhalation module (510) collects the gas leaked from the container ($S_2$). The collected leaked gas flows through the inhalation pipe (550), and is finally collected in the tank coupled to the inhalation pipe by the inhalation pump (570).

Next, the inhalation module (510) in the above inhalation assembly (500) will be described with reference to FIG. 6.

Figure 6:
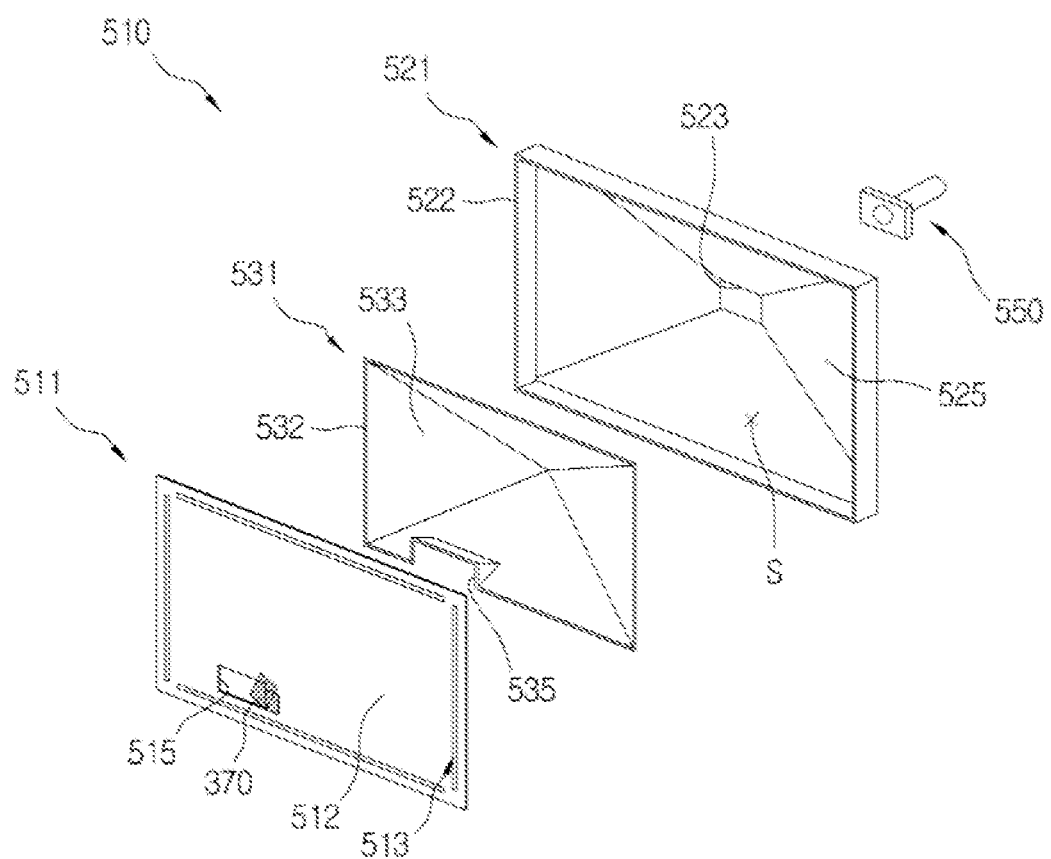
FIG. 6 is an exploded perspective view of an inhalation module (510) and an inhalation pipe (550) of FIG. 2.

FIG. 6 is an exploded perspective view of the inhalation module (510) and the inhalation pipe (550) of FIG. 2.

Referring to this drawing, the inhalation module (510) can include an inhalation plate (511), an outer hood (521), and an inner hood (531).

The inhalation plate (511) can be a substantially quadrangular plate material. An inhalation surface (512) that is an outer surface of the inhalation module (510) is arranged so as face the side surface of the container ($S_2$, refer to FIG. 1). The edge of the inhalation plate (511) can be formed with an inhalation slit (513). The inhalation slit (513) can be continuously formed in the edge so as to form a substantially closed roof. The closed roof forms a substantially quadrangular shape depending on the inhalation plate (511), and is interrupted at portions serving as four vertices. A removed portion (515) is formed in a portion of the inhalation plate (511).

The outer hood (521) is coupled with the inhalation plate (511) to form an internal space (S). In the present embodiment, the outer hood (521) has a form of a quadrangular weight corresponding to the quadrangular inhalation plate (511). Specifically, the outer hood (521) can have a quadrangular front surface portion (522), a rear surface portion (523) that similarly has a quadrangular shape, and a side surface portion (525) that couple the front and rear surface portions together. Here, the front surface portion (522) and the rear surface portion (523) form a quadrangular opening portion. The inhalation pipe (550) is coupled to the rear surface portion (523). The side surface portion (525) consists of a total of four trapezoids.

The inner hood (531) is arranged in the internal space (S). Although the inner hood (531) has a shape similar to the outer hood (521), the size thereof can be smaller than that of the outer hood (521). Accordingly, the inner hood (531) can include the front surface portion (532) and the side surface portion (533). In this case, the front surface portion (522) forms a quadrangular open portion, and the side surface portion (525) consists of four triangular shapes. The size of the front surface portion (522) is determined at the level such that the front surface portion can be located within a region defined by the inhalation slit (513). The rear surface of the inner hood (531) is in a closed state unlike the outer hood (521). A portion of the inner hood (531) can be formed with a removed portion (535) corresponding to the removed portion (515) of the inhalation plate (511). The active advance and retraction stocking system (300) can further include a sensor bracket (370), serving as an indication for allowing the vehicle (200, FIG. 1) to recognize the active advance and retraction stocking system (300), corresponding to the removed portions (515 and 535). The sensor bracket (370) is installed on the inhalation plate (511), and the removed portions (515 and 535) expose the sensor bracket (370) to form a space for the escape of the sensor bracket.

In the above, the inhalation plate (511), the outer hood (521), and the inner hood (531) can be made of a lightweight material, such as acryl. Additionally, the inhalation plate, the outer hood, and the inner hood can be coupled by bonding so as to prevent the gas from leaking therebetween.

According to such a configuration, the inhalation slit (513) is located corresponding to the portion where gas leakage occurs in the container ($S_2$, FIG. 1). The leaked gas that has flowed into the internal space (S) via the inhalation slit (513) flows to the inhalation pipe (550) through a flow passage between the inner hood (531) and the outer hood (521). In other words, the inner hood (531) reduces the cross-sectional area of the internal space (S) in which the leaked gas flows, thereby enhancing the flow velocity of the leaked gas.

Next, a purge assembly (700) and an inhalation assembly (800) of the fixed stocking system (600) other than the active advance and retraction stocking system (300) will be described with reference to FIGS. 7 and 8. Here, although the configuration of the fixed stocking system (600) is different from that of the active advance and retraction stocking system (300), the fixed stocking system is the same as the active advance and retraction stocking system in that the fixed stocking system is installed beside the vehicle rail (110) and stocks the container ($S_2$) transferred from the vehicle (200). Additionally, the purge assembly (700) and the inhalation assembly (800) are almost the same as or partially different from those of the aforementioned embodiment.

Figure 7:
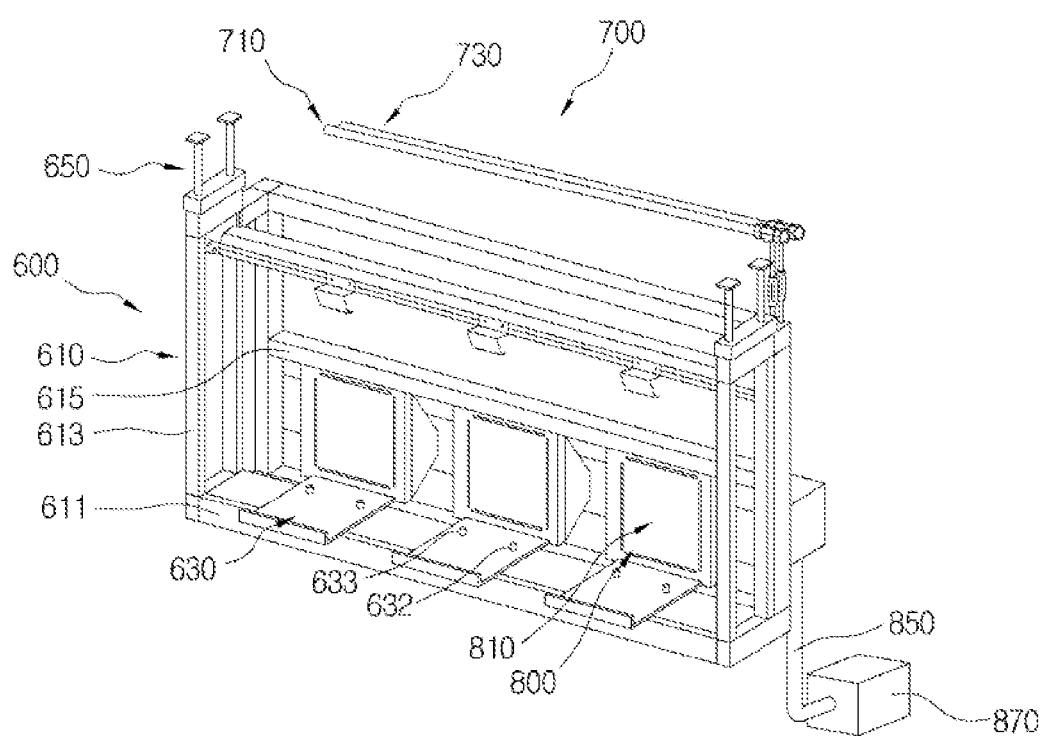
FIG. 7 is a perspective view illustrating a coupled state of a fixed stocking system (600), a purge assembly (700), and an inhalation assembly (800) according to another embodiment of the invention.

FIG. 7 is a perspective view illustrating a coupled state of the fixed stocking system (600), the purge assembly (700), and the inhalation assembly (800), according to the other embodiment of the invention.

Referring to this drawing, first, the fixed stocking system (600) can include a main body (610), a shelf (630), and a fastening unit (650).

The main body (610) is a portion that forms a framework of the stocking system (600). The main body (610), specifically, can include a bottom frame (611), a vertical frame (613), and a horizontal frame (615). The bottom frame (611) is arranged so as to be substantially horizontal with respect to the ceiling (C, FIG. 1). The vertical frame (613) and the horizontal frame (615) are portions that constitute the side walls of the main body (610). The vertical frame (613) is substantially vertical to the bottom frame (611), and the horizontal frame (615) is arranged substantially parallel to the bottom frame (611).

The shelf (630) is installed in the main body (610) and is formed so as to support the container ($S_2$, FIG. 1). Specifically, the shelf (630) is installed on the bottom frame (611) of the main body (610), and is substantially arrayed parallel to the ceiling (C). One or more shelves (630) can be provided on one bottom frame (611). The present embodiment illustrates that three shelves (630) are installed on one bottom frame (611). The shelf (630) is provided with a supply nozzle (632) and an exhaust nozzle (633) that are formed so as to communicate with the interior of the container ($S_2$, FIG. 1).

The fastening unit (650) is installed on the main body (610), specifically, on the vertical frame (613), and the main body (610) is fastened to the ceiling (C). The fastening unit (650) can be the same as the configuration in which the vehicle rail (110, FIG. 1) is fastened to the ceiling (C).

The purge assembly (700) can include a supply unit (710) and an exhaust unit (730), similar to the above-mentioned embodiment. The supply unit (710) is coupled to the supply nozzle (632), and the exhaust unit (730) is coupled to the exhaust nozzle (633). The purge assembly (700) does not need components, such as the third flexible subsidiary pipes (416 and 436), unlike the purge assembly (400) of the above-mentioned embodiment. This is because the fixed stocking system (600) does not move unlike the active advance and retraction stocking system (300).

The inhalation assembly (800) can be fixed to the bottom frame (611) and the horizontal frame (615) of the fixed stocking system (600). The inhalation assembly (800) can include an inhalation module (810), an inhalation pipe (850) and an inhalation pump (870), similar to the inhalation assembly (500) of the above-mentioned embodiment.

The inhalation module (810) in such an inhalation assembly (800) will mainly be described with reference to FIG. 8.

Figure 8:
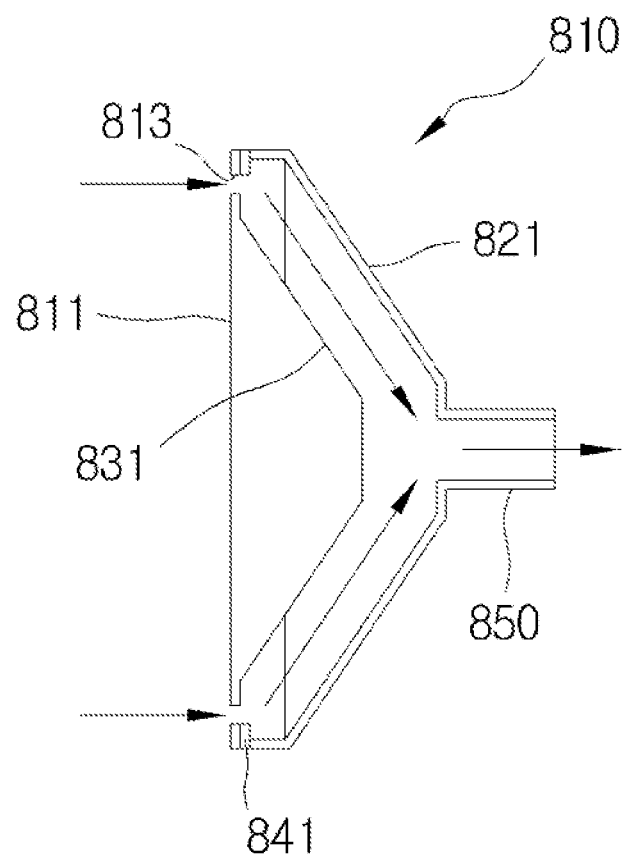
FIG. 8 is a side cross-sectional view in a coupled state of an inhalation module (810) of FIG. 7.

FIG. 8 is a side cross-sectional view of the inhalation module (810) of FIG. 7.

Referring to this drawing, the inhalation module (810) can include an inhalation plate (811) that has an inhalation slit, an outer hood (821), and an inner hood (831), similar to the inhalation module (510) of the above-mentioned embodiment.

Accordingly, the leaked gas that has flowed into the inhalation slit through a flow passage between the inner hood (831) and the outer hood (821) flows to the inhalation pipe (850) side.

In this case, the inhalation plate (811), the outer hood (821), and the inner hood (831) can be formed of a metal material, such as stainless steel, unlike the above-mentioned inhalation module (510). In this case, welding can be used for the coupling between these components.

Additionally, a closed roof type sealing member (841) can be provided for prevention of leakage between the inhalation plate (811) and the outer hood (821). The sealing member (841) can be, for example, a gas kit.

The apparatus of an inhalation type for stocking a wafer at a ceiling and the inhaling type wafer stocking system having the same, as mentioned above, are not limited to the configuration and the operation method of the embodiments that are described above. The aforementioned embodiment can also be configured so that all or some of each embodiment are selectively combined and various modifications are realized.

DESCRIPTION OF REFERENCE NUMERALS AND SIGNS

110: VEHICLE RAIL
150: FRAME
200: VEHICLE
300: ACTIVE MOVEMENT TYPE STOCKING SYSTEM
310: FIXED BODY
350: MOVABLE BODY
351: SHELF
352: SUPPLY NOZZLE
353: EXHAUST NOZZLE
400, 700: PURGE ASSEMBLY
410, 710: SUPPLY UNIT
411: MAIN PIPE
413: SUBSIDIARY PIPE
417: SUPPLY VALVE
419: SUPPLY FLOWMETER
430, 730: EXHAUST UNIT
431: MAIN PIPE
433: SUBSIDIARY PIPE
437: EXHAUST VALVE
439: EXHAUST FLOWMETER
450: CONTROL UNIT
500, 800: INHALATION ASSEMBLY
510, 810: INHALATION MODULE
550, 850: INHALATION PIPE
570, 870: INHALATION PUMP
600: FIXED STOCKING SYSTEM
610: MAIN BODY
630: SHELF
650: FASTENING UNIT

What is claimed is:

1. An apparatus of an inhalation type for stocking a wafer at a ceiling, comprising:
a stocking system including a shelf that is fixed to a ceiling and supports a container in which a wafer is present; and
an inhalation assembly that is installed in the stocking system so as to correspond to the shelf and is configured so as to inhale gas that leaks from the container;
wherein the inhalation assembly includes an inhalation module having an inhalation surface that intersects a main surface of the shelf; and
the inhalation module includes:
an inhalation late that forms an inhalation surface and is formed with an inhalation slit; and
an outer hood that is coupled to the inhalation plate and forms an internal space.

2. The apparatus of an inhalation type for stocking a wafer at a ceiling according to claim 1,
wherein the inhalation slit is formed at an edge of the inhalation plate.

3. The apparatus of an inhalation type for stocking a wafer at a ceiling according to claim 2,
wherein the inhalation slit has a plurality of sides corresponding to a closed roof.

4. The apparatus of an inhalation type for stocking a wafer at a ceiling according to claim 2,
wherein the inhalation module further includes:
an inner hood that is arranged in an internal space and is located within a region defined by the inhalation slit.

5. The apparatus of an inhalation type for stocking a wafer at a ceiling according to claim 4,
wherein the inner hood has the same shape as the outer hood and has a size smaller than the outer hood.

6. The apparatus of an inhalation type for stocking a wafer at a ceiling according to claim 4,
wherein the inhalation module further includes:
a sealing member that is formed by a closed roof surrounding the inner hood and is arranged between the inhalation plate and the outer hood.

7. The apparatus of an inhalation type for stocking a wafer at a ceiling according to claim 1,
wherein the inhalation assembly further includes:
an inhalation pipe that communicates with the internal space of the outer hood; and
an inhalation pump that is coupled to the inhalation pipe.

8. The apparatus of an inhalation type for stocking a wafer at a ceiling according to claim 4,
wherein the inhalation plate and the inner hood are respectively formed with removed portions corresponding to each other, and
wherein the stocking system includes a sensor bracket that is installed in the inhalation plate and is located in the removed portion.

9. The apparatus of an inhalation type for stocking a wafer at a ceiling according to claim 1, further comprising:
a purge assembly that is installed in the stocking system so as to communicate with the container located on the shelf and that injects gas into the container to purge the wafer.

10. The apparatus of an inhalation type for stocking a wafer at a ceiling according to claim 9,
wherein the purge assembly includes:
a supply unit that is configured so as to supply the gas into the interior of the container; and
an exhaust unit that is configured so as to exhaust gas injected into the interior of the container.

11. The apparatus of an inhalation type for stocking a wafer at a ceiling according to claim 10,
wherein the shelf includes a supply nozzle and an exhaust nozzle that are formed so as to communicate with the interior of the container, and
wherein each of the supply unit and the exhaust unit includes:
a main pipe that is formed so that the gas flows therethrough; and
a subsidiary pipe that is branched from the main pipe and is coupled to the supply nozzle or the exhaust nozzle.

12. An inhaling type wafer stocking system comprising:
a vehicle rail that is fixed to a ceiling;
a vehicle that is movably coupled to the vehicle rail and carries a container, in which a wafer is present, along the vehicle rail;
a stocking system that is located beside the vehicle rail and is configured so as to have the container transferred thereto from the vehicle and stock the container;
a purge assembly that is installed in the stocking system and is configured so as to inject gas into the container and purge the wafer; and
an inhalation assembly is installed in the stocking system and is configured so as to inhale the gas that leaks from the container;
wherein the stocking system includes a shelf that supports the container and has a supply nozzle and an exhaust nozzle coupled to the purge assembly,
the purge assembly includes an inhalation module having an inhalation surface that intersects a main surface of the shelf, and
the inhalation module includes:
an inhalation plate that forms an inhalation surface and is formed with an inhalation slit; and an outer hood that is coupled to the inhalation plate and forms an internal space.

13. The inhaling type wafer stocking system according to claim 12,
wherein the stocking system further includes:
a container detecting sensor that detects that the container is located, and
wherein the purge assembly and the inhalation assembly are operated if it is determined that the container is located on the shelf through the container detecting sensor.

* * * * *

UNITED STATES PATENT AND TRADEMARK OFFICE
CERTIFICATE OF CORRECTION

PATENT NO. : 9,550,219 B2
APPLICATION NO. : 14/584675
DATED : January 24, 2017
INVENTOR(S) : Lee et al.

It is certified that error appears in the above-identified patent and that said Letters Patent is hereby corrected as shown below:

In the Claims

Column 11, Line 47, delete "late" and insert --plate-- therefore.

Signed and Sealed this
Tenth Day of April, 2018

Andrei Iancu
*Director of the United States Patent and Trademark Office*